(12) United States Patent  (10) Patent No.: US 7,736,527 B2
Kim et al.  (45) Date of Patent: Jun. 15, 2010

(54) SILOXANE POLYMER COMPOSITIONS AND METHODS OF MANUFACTURING A CAPACITOR USING THE SAME

(75) Inventors: Kyoung-Mi Kim, Anyang-si (KR);
Myung-Sun Kim, Daegu (KR);
Young-Ho Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 333 days.

(21) Appl. No.: 12/008,215

(22) Filed: Jan. 9, 2008

(65) Prior Publication Data

US 2008/0171137 A1   Jul. 17, 2008

(30) Foreign Application Priority Data

Jan. 16, 2007   (KR) ...................... 10-2007-0004574

(51) Int. Cl.
*H01G 4/01* (2006.01)
*C08G 77/50* (2006.01)
*B05D 5/12* (2006.01)

(52) U.S. Cl. ............................... 216/6; 528/35; 528/33; 438/244; 438/253; 438/387; 438/397; 427/80

(58) Field of Classification Search .................... 427/80
See application file for complete search history.

(56) References Cited

U.S. PATENT DOCUMENTS 6,607,954 B2 *   8/2003   Jeon et al. .................... 438/244
2007/0026625 A1 *   2/2007   Chung et al. ................ 438/396

FOREIGN PATENT DOCUMENTS

JP   6-271772   9/1994
KR   1998-042389   8/1998
KR   0597599   6/2006

OTHER PUBLICATIONS

Ignat'Eva et al., Polyallylcarbosilane dendrimers: synthesis and glass transition, Polymer Science, 1997.*

* cited by examiner

*Primary Examiner*—Michael Cleveland
*Assistant Examiner*—Lisha Jiang
(74) *Attorney, Agent, or Firm*—Mills & Onello, LLP

(57) ABSTRACT

Siloxane polymer compositions and methods of manufacturing a capacitor are described. In some embodiments, a mold layer pattern is formed on a substrate having a conductive structure, and the mold layer pattern has an opening to expose the conductive structure. A conductive layer is formed on the substrate. A buffer layer pattern is formed on the conductive layer formed in the opening. The buffer layer pattern includes a siloxane polymer represented by the following Chemical Formula 1. The conductive layer is selectively removed to form a lower electrode. The mold layer pattern and the buffer layer pattern are removed. A dielectric layer and an upper electrode are formed on the substrate to form a capacitor. The methods may simplify manufacturing processes for a capacitor and a semiconductor device, and may improve their efficiencies.

<Chemical Formula 1>

-continued
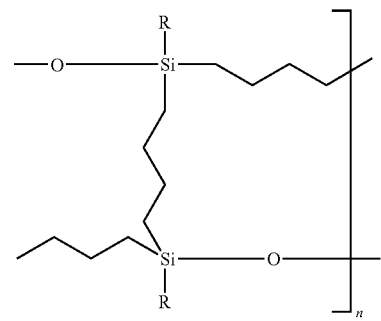
6 Claims, 12 Drawing Sheets

SILOXANE POLYMER COMPOSITIONS AND METHODS OF MANUFACTURING A CAPACITOR USING THE SAME

CROSS-REFERENCE TO RELATED APPLICATIONS

This application claims priority under 35 U.S.C. §119 to Korean Patent Application No. 2007-4574, filed on Jan. 16, 2007, in the Korean Intellectual Property Office (KIPO), the contents of which are herein incorporated by reference in their entirety.

FIELD OF THE INVENTION

Exemplary embodiments of the present invention relate to siloxane polymer compositions and methods of manufacturing a capacitor using the same. Some exemplary embodiments of the present invention relate to siloxane polymer compositions that may be used for filling an opening and methods of manufacturing a capacitor using the siloxane polymer compositions.

BACKGROUND

A capacitor employed in an electronic device, for example, a dynamic random access memory (DRAM) device, can include a lower electrode, a dielectric layer and an upper electrode. In order to improve the capacitance of a memory device having the capacitor, improving the electric capacitance of the capacitor can be important. Thus, the capacitor can have a flat shape so as to have a large capacitance; however, the shape of the capacitor has gradually changed into a box shape or a cylindrical shape to have a relatively large aspect ratio, for example, because the area of a unit cell of the DRAM device recently has reduced as integration of the DRAM device has decreased to the giga-size range.

A cylindrical capacitor typically includes a lower electrode having a cylindrical shape. A buffer layer pattern may be used in a node-separation process to form the lower electrode having the cylindrical shape, and examples of materials that may be used for the buffer layer pattern include an oxide, a photosensitive material, etc.

In order to form the buffer layer pattern including an oxide, a buffer oxide layer can be formed through an oxide deposition process, and then the buffer oxide layer can be etched through an etch-back process or a chemical mechanical polishing (CMP) process. As a result, forming the buffer layer pattern requires can take a long time for the deposition process and the etching process. Additionally, a void may be formed in the buffer layer pattern. An atomic layer deposition (ALD) process can be required to form a buffer layer pattern without the void.

In order to form the buffer layer pattern including a photosensitive material, a photoresist film is formed. Thereafter, an exposing process, a developing process using a developing solution, a cleaning process and a baking process are typically sequentially performed on the photoresist film. High-cost exposure devices can be needed to form the buffer layer pattern. Furthermore, a baking process to harden the photoresist film at a temperature more than about 270° C. may be needed. A photoresist film hardened through a high temperature baking process may not be easily removed through a plasma ashing process.

Moreover, the lower electrode of the buffer layer pattern may be damaged while the ashing process and the cleaning process are performed. The buffer layer pattern may not be easily removed by a conventional ashing process, and residue of the buffer layer pattern that remains in an opening may serve as a resistance that causes the capacitor to malfunction. In order to improve the efficiency of the ashing process for removing the buffer layer pattern, an oxygen plasma ashing process may be performed at a temperature of about 150° C. to about 250° C. However, a high temperature ashing process may deteriorate and/or oxidize the lower electrode so the capacitor may not have a desired electric capacitance.

SUMMARY OF THE INVENTION

Example embodiments of the present invention provide siloxane polymer compositions including a siloxane polymer capable of improving gap-filling characteristics of a buffer layer.

Example embodiments of the present invention also provide methods of manufacturing a capacitor of a semiconductor device using the siloxane polymer compositions.

According to one aspect of the present invention, a siloxane polymer composition includes about 2% to about 7% by weight of a siloxane polymer represented by the following Chemical Formula 1 and about 93% to about 98% by weight of an organic solvent.

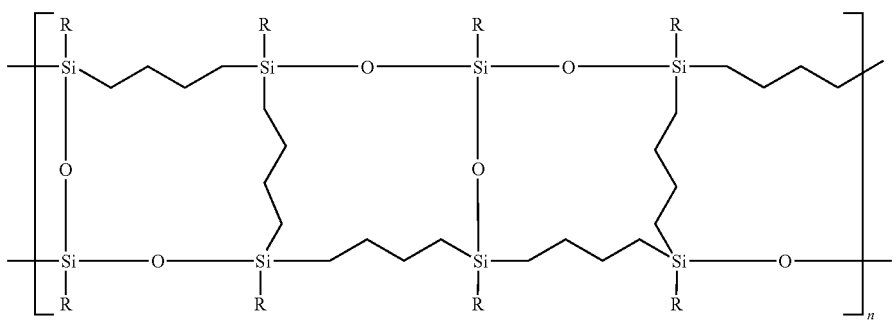

<Chemical Formula 1>

In Chemical Formula 1, each R may independently represent an alkyl group having 1 to 5 carbon atoms, and n may be a natural number such that the number-average molecular weight of the siloxane polymer may be about 5,000 to about 8,000.

In some embodiments, the number-average molecular weight of the siloxane polymer may be about 5,000 to about 8,000, and the polydispersity index (PDI) of the siloxane polymer may be about 1.3 to about 1.7.

According to another aspect of the present invention, there is provided a method of manufacturing a capacitor. In the method, a mold layer pattern is formed on a substrate having a conductive structure, and the mold layer pattern has an opening to expose the conductive structure. A conductive layer is formed on the bottom and sidewalls of the opening and on the mold layer pattern. A buffer layer pattern is formed on the conductive layer formed in the opening. The buffer layer pattern includes a siloxane polymer represented by Chemical Formula 1, wherein each R independently represents an alkyl group having 1 to 5 carbon atoms, and n represents a natural number. The conductive layer on the mold layer pattern is selectively removed to form a lower electrode. The mold layer pattern and the buffer layer pattern are removed through the same process using an etching solution including hydrofluoric acid. A dielectric layer is formed on the substrate having the lower electrode. An upper electrode is formed on the dielectric layer. A capacitor of a semiconductor device may be completed.

In some embodiments, a buffer layer pattern includes a siloxane polymer having a number-average molecular weight of about 5,000 to about 8,000 and being represented by Chemical Formula 1. The buffer layer pattern may have characteristics substantially similar to a silicon oxide layer pattern. Thus, the buffer layer pattern may be removed with the oxide layer pattern through a wet-etching process after a conductive layer pattern is formed. The methods using the siloxane polymer composition may simplify manufacturing processes for a capacitor and a semiconductor device, and may improve their efficiencies.

BRIEF DESCRIPTION OF THE DRAWINGS

The above and other features and advantages of the present invention will become more apparent by describing exemplary embodiments thereof with reference to the accompanying drawings, in which.

DESCRIPTION OF THE EMBODIMENTS

Figure 1:
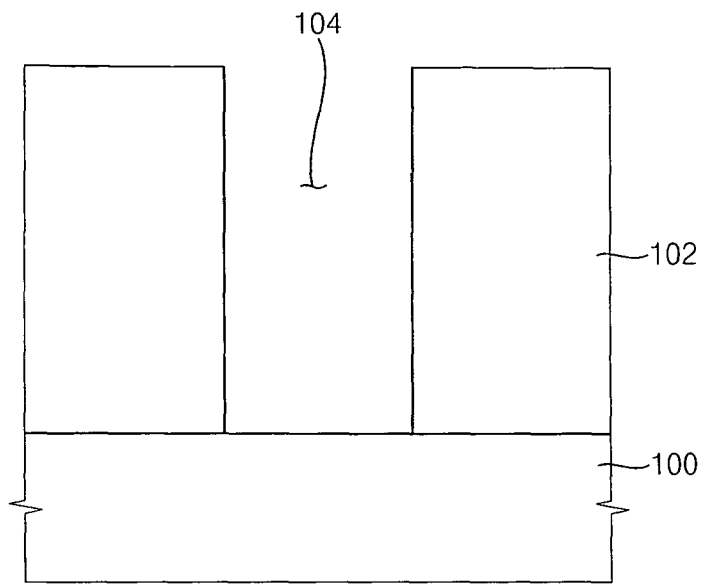
FIGS. 1 through 6 are cross-sectional views illustrating a method of forming a pattern according to exemplary embodiments of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to, or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to illustrations or cross sections that are schematic illustrations of idealized embodiments (and intermediate structures) of the present invention. As such, variations from the shapes of the illustrations accordingly, for example, of manufacturing techniques and/or tolerances, are to be expected. Exemplary embodiments of the present invention should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Siloxane Polymer Compositions

Siloxane polymer compositions according to example embodiments of the present invention include an organic solvent and a siloxane polymer represented by the following Chemical Formula 1. A siloxane polymer composition may be spin-coated on a pattern having an opening to form a silicone oxide layer sufficiently filling the opening. In some embodiments, the siloxane polymer composition includes about 2% to about 7% by weight of the siloxane polymer and about 93% to about 98% by weight of an organic solvent.

tions so that the siloxane polymer compositions have characteristics suitable for a spin-coating method to form the silicone oxide layer. Examples of the organic solvent include an alcohol. Furthermore, examples of the organic solvent include an organic solvent that is soluble in water. Particular examples of the organic solvent include methanol, ethanol, butanol, propanol, isopropyl alcohol, n-butanol, 1-methoxy-2-propanol, methoxypropyl acetate, propylene glycol monomethyl ether acetate, propylene glycol monomethyl ether, isobutyl alcohol, t-butyl alcohol and the like. These may be used alone or in a combination thereof. Since the concentration of the organic solvent in the composition may vary to provide compositions that are capable of being coated through a spin-coating method, the concentrations of the organic solvent may not be limited to a specific range.

The siloxane polymer may be formed by cross-linking a silicone compound represented by the following Chemical Formula 2. In Chemical Formula 2, each R independently represents an alkyl group having 1 to 5 carbon atoms. Examples of the alkyl group include a methyl group, an ethyl

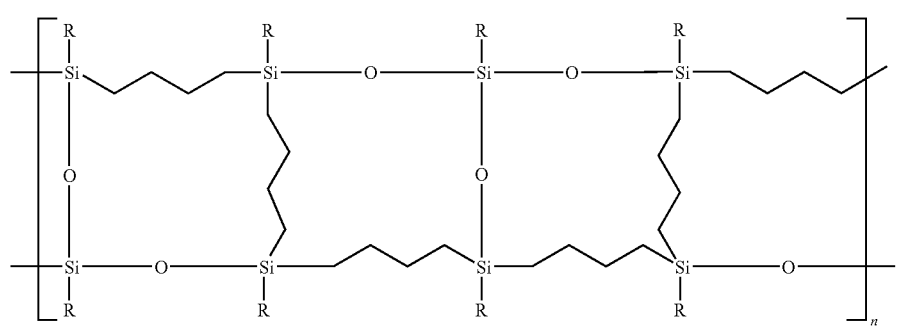

<Chemical Formula 1>

The number-average molecular weight of the siloxane polymer may be about 5,000 to about 8,000, and the polydispersity index (PDI) of the siloxane polymer may be about 1.3 to about 1.7. In Chemical Formula 1, each R may independently represent an alkyl group having 1 to 5 carbon atoms, and n may be a natural number such that the number-average molecular weight of the siloxane polymer may be about 5,000 to about 8,000.

When the number-average molecular weight of the siloxane polymer is more than about 8,000, a buffer layer formed from the siloxane polymer compositions may not sufficiently fill an opening. When the number-average molecular weight of the siloxane polymer is less than about 5,000, an etch resistance of a silicone oxide layer pattern formed through a subsequent process may be reduced. Thus, the number-average molecular weight of the siloxane polymer may be about 5,000 to about 8,000, for example, about 5,500 to about 7,000.

When the content of the siloxane polymer is more than about 7% by weight or less than about 2% by weight, the silicone oxide layer may not have a uniform thickness. Thus, the siloxane polymer compositions may include about 2% to about 7% by weight of the siloxane polymer, for example, about 3% to about 6% by weight of the siloxane polymer.

The organic solvent may dissolve the siloxane polymer and may control the viscosity of the siloxane polymer composigroup, an isopropyl group, a butyl group and the like. In some embodiments, the siloxane polymer may be formed by cross-linking the silicone compound in the presence of a catalyst, such as platinum, etc. An example of the silicone compound includes tris(diethylenemethyl)methylsilane.

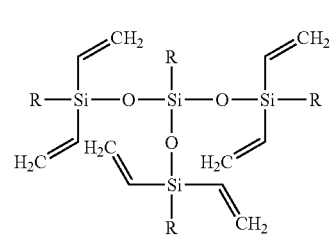

<Chemical Formula 2>

As an example, the silicone compound may be formed by reacting a first silicone compound represented by the following Chemical Formula 3 and a second silicone compound represented by the following Chemical Formula 4.

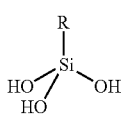

<Chemical Formula 3>

-continued

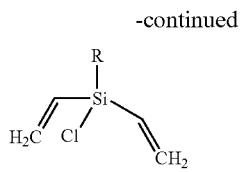

<Chemical Formula 4>

Each of the hydroxyl groups of the first silicone compound represented by Chemical Formula 3 may react with the second silicone compound represented by Chemical Formula 4 to form the silicone compound represented by Chemical Formula 2. Hydrogen chloride may be generated in the reaction of the first silicone compound and the second silicone compound.

Methods of Forming a Pattern

FIGS. 1 through 6 are cross-sectional views illustrating a method of forming a pattern according to example embodiments of the present invention.

Referring to FIG. 1, an insulation layer pattern 102 is formed on a substrate 100. The insulation layer pattern 102 has an opening 104 to expose a portion of an upper surface of the substrate 100. Examples of the substrate 100 may include a silicon substrate having an insulating interlayer and a contact pad passing through the insulating interlayer. An insulation material may be deposited on the substrate 100 through a vapor deposition process to form an insulation layer. Examples of a material that may be included in the insulation layer may include borophosphosilicate glass (BPSG), phosphosilicate glass (PSG), undoped silicate glass (USG), spin-on glass (SOG), plasma-enhanced tetraethyl orthosilicate (PE-TEOS) and the like. The insulation layer is patterned to form the insulation layer pattern 102.

etched using a limulus amebocyte lysate (LAL) etching solution including deionized water, ammonium hydrofluoride and hydrofluoric acid to form the insulation layer pattern 102. Alternatively, the insulation layer may be dry-etched using an etching gas including hydrofluoric acid anhydride, isopropyl alcohol and/or water vapor to form the insulation layer pattern 102. Before the insulation layer is formed, an etch-stop layer (not shown) may be formed on the substrate 100 to prevent damage to the substrate 100 when the insulation layer pattern 102 having the opening 104 is formed.

Figure 2:
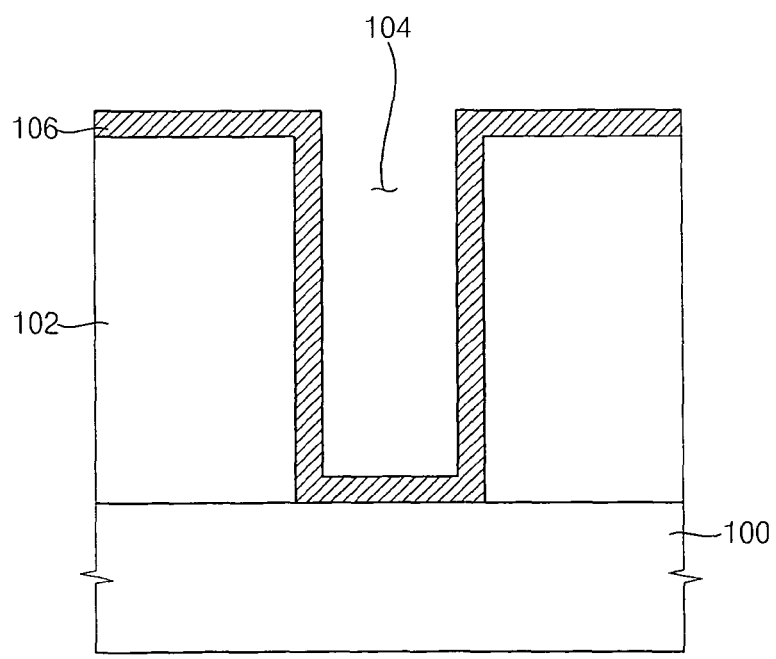

Referring to FIG. 2, a conductive layer 106 is formed on the insulation layer pattern 102 and in the opening 104. For example, a conductive material may be deposited in the opening 104 and on the insulation layer pattern 102 through a vapor deposition process to form the conductive layer 106 having a substantially uniform thickness. Examples of conductive materials include polysilicon, tungsten (W), titanium (Ti), titanium nitride (TiN), tungsten nitride (WN) and the like. These may be used alone or in a combination thereof. When a single conductive material is used, the conductive layer 106 may have a single-layer structure. When a combination of the conductive materials is used, the conductive layer 106 may have a multilayer structure. In example embodiments, the conductive layer 106 has a is multilayer structure including a titanium layer and a titanium nitride layer that are sequentially deposited.

Figure 3:
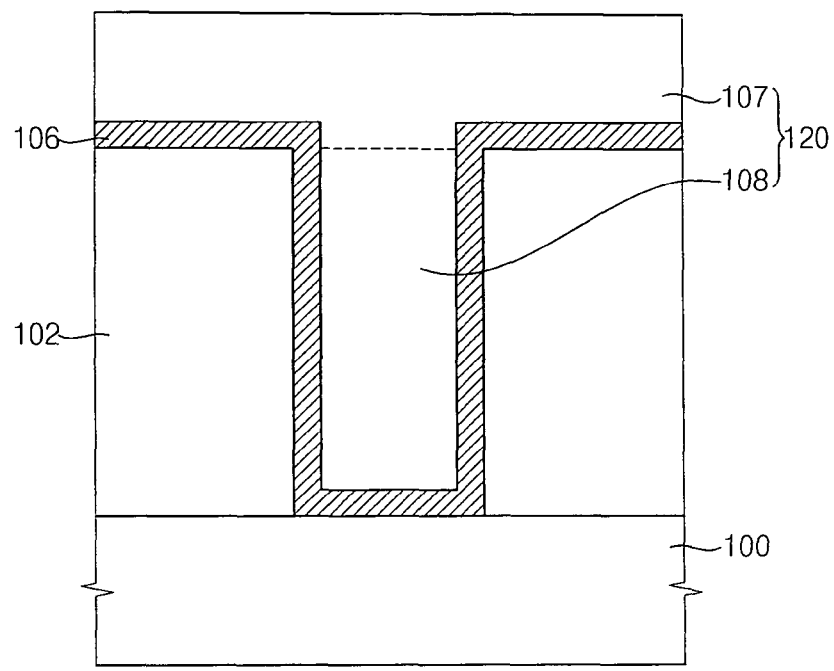

Referring to FIG. 3, a preliminary buffer layer 120 is formed to fill the opening 104 having the conductive layer 106 and to cover the conductive layer 106 on the insulation layer pattern 102. The preliminary buffer layer 120 may be formed by spin-coating a polysiloxane composition including an organic solvent and a siloxane polymer represented by the following Chemical Formula 1. For example, the polysiloxane composition may include about 2% to about 7% by weight of the siloxane polymer and about 93% to about 98% by weight of the organic solvent.

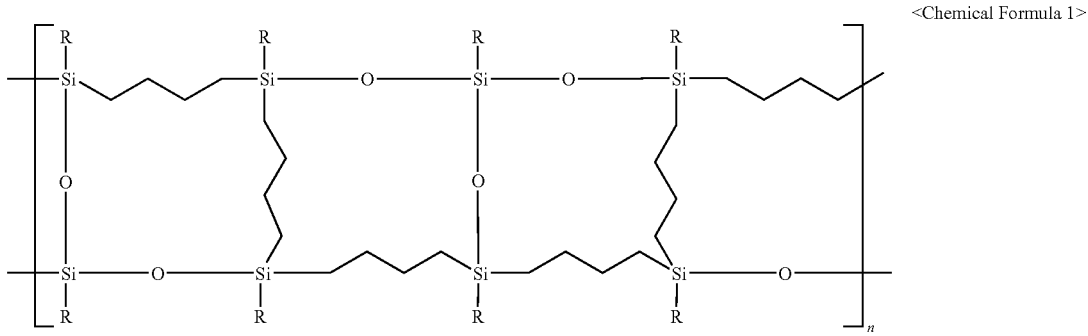

<Chemical Formula 1>

In example embodiments, the insulation layer may have a thickness of about 5,000 Å to about 20,000 Å from the upper surface of the substrate 100. The thickness of the insulation layer may vary depending on a desired thickness of a conductive pattern since the thickness of the conductive pattern formed after the insulation layer depends on the thickness of the insulation layer. Thereafter, a mask pattern (not shown) is formed on the insulation layer. The mask pattern can include a material having a high etching selectivity with respect to the insulation layer. Examples of materials that may be included in the mask pattern include silicon oxide, silicon oxide nitride and the like. The insulation layer exposed through the mask pattern is etched to expose the upper surface of the substrate 100. For example, the insulation layer may be wet- The number-average molecular weight of the siloxane polymer may be about 5,000 to about 8,000, and the PDI of the siloxane polymer may be about 1.3 to about 1.7. In Chemical Formula 1, each R may independently represent an alkyl group having 1 to 5 carbon atoms, and n may be a natural number such that the number-average molecular weight of the siloxane polymer may be about 5,000 to about 8,000. The siloxane polymer and the siloxane polymer composition are substantially the same as the above-explained siloxane polymer and the above-explained siloxane polymer composition. Thus, any further explanations in these regards will be omitted.

The preliminary buffer layer 120 may include an upper preliminary buffer layer 107 and a lower preliminary buffer layer 108. The upper preliminary buffer layer 107 may be removed through a subsequent etching process, and the lower preliminary buffer layer 108 may remain in the opening 104 after a developing process.

A baking process is performed to harden the preliminary buffer layer 120. For example, the baking process may be performed at a temperature of about 160° C. to about 240° C., for example, at a temperature of about 180° C. to about 220° C. As a result, a buffer layer including the siloxane polymer can be formed. The buffer layer fills the opening 104 and covers the upper surface of the conductive layer 106. The buffer layer may be a spin-on-glass layer.

Figure 4:
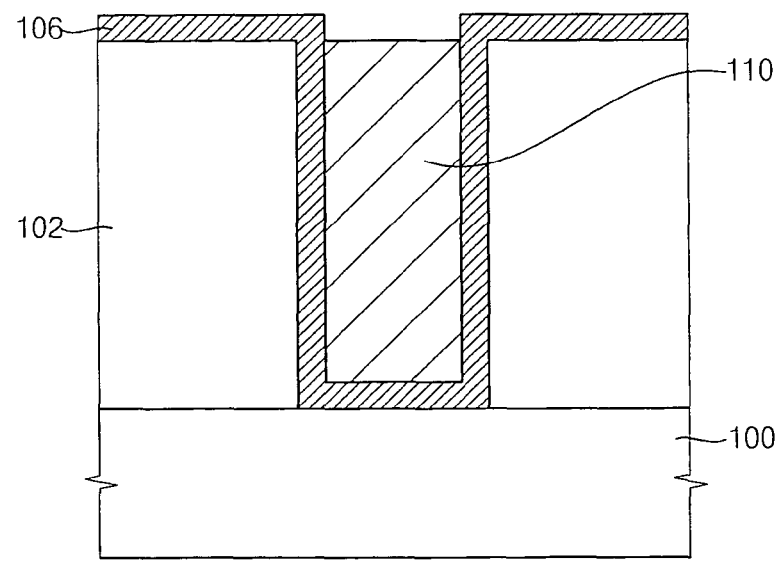

Referring to FIG. 4, the buffer layer 120 is then etched to expose the conductive layer 106 disposed on the insulation layer pattern 102. For example, the buffer layer 120 may be etched through a wet-etching process using an etching solution including hydrofluoric acid. As a result, a buffer layer pattern 110 is formed on the conductive layer 106 in the opening 104.

Figure 5:
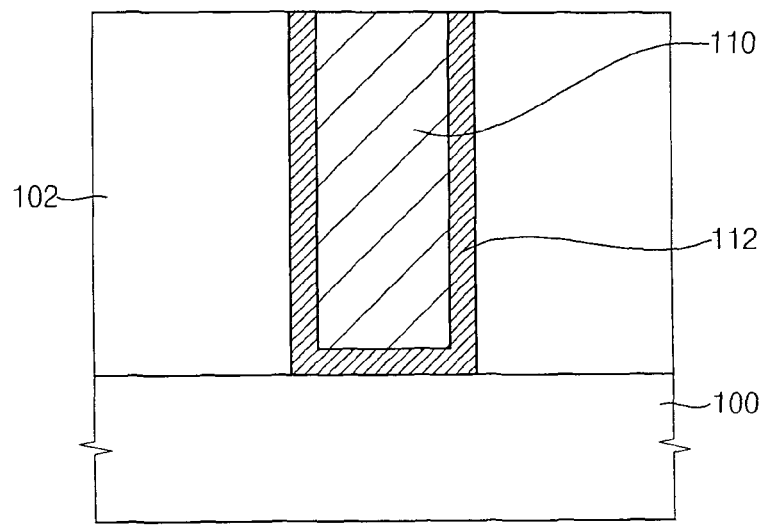

Referring to FIG. 5, the conductive layer 106 disposed on the upper surface of the insulation layer pattern 102 is etched by using the buffer layer pattern 110 as an etching mask. For example, the conductive layer 106 disposed on the upper surface of the insulation layer pattern 102 may be etched by using the buffer layer pattern 110 as a mask to expose the upper surface of the insulation layer pattern 102. Remaining portions of the conductive layer 106 form a conductive layer pattern 112 having a cylindrical shape and contacting an inner wall of the insulation layer pattern 102, which surrounds the opening 104. Damage to the conductive layer pattern 112 may be prevented and/or reduced when the conductive layer 106 is etched. After the conductive layer pattern 112 is formed, a cleaning process may be performed to remove any etching residue remaining on the insulation layer pattern 102 and the conductive layer pattern 112. For example, the cleaning process may be performed using isopropyl alcohol, deionized water and the like.

Figure 6:
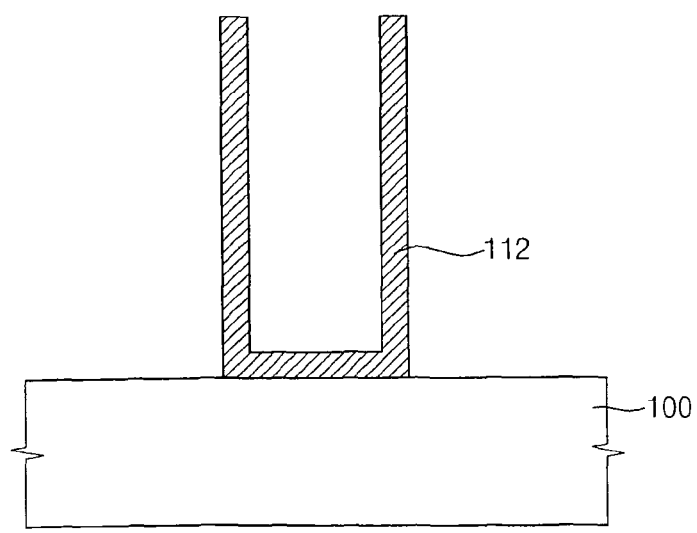

Referring to FIG. 6, the insulation layer pattern 102 on the substrate 100 is removed with the buffer layer pattern 110 surrounded by the conductive layer pattern 112. For example, the insulation layer pattern 102 and the buffer layer pattern 110 may be removed through a wet-etching process using an etching solution. The etching solution may be an LAL solution including water, hydrofluoric acid and ammonium hydrofluoride. Since both of the insulation layer pattern 102 and the buffer layer pattern 110 can include silicon oxide, the insulation layer pattern 102 and the buffer layer pattern 110 may be removed through the same process using the LAL solution. After removal of the insulation layer pattern 102 and the buffer layer pattern 110, the conductive layer pattern 112 having a cylindrical shape is formed on the substrate 100. The methods of forming a pattern according to example embodiments of the present invention may be variously used in other methods of forming a cylindrical shaped pattern of a semiconductor device.

Methods of manufacturing a capacitor of a semiconductor will be described fully hereinafter.

Method of Manufacturing a Capacitor

FIGS. 7 through 15 are cross-sectional views illustrating a method of manufacturing a capacitor according to example embodiments of the present invention.

Figure 7:
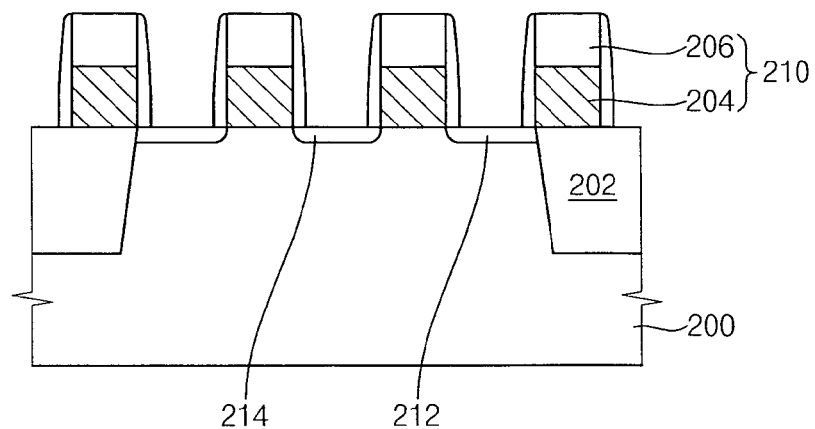
FIGS. 7 through 15 are cross-sectional views illustrating a method of manufacturing a capacitor according to exemplary embodiments of the present invention.

Referring to FIG. 7, an isolation layer 202 is formed at an upper portion of a substrate 200, for example, a semiconductor substrate, through a shallow trench isolation (STI) process to divide the substrate 200 into an active region and a field region.

Thereafter, a gate insulation layer is formed on the substrate 200 having the isolation layer 202 through, for example, a thermal oxidation process, a chemical vapor deposition (CVD) process, an atomic layer deposition (ALD) process and the like. Examples of materials that may be used for the gate insulation layer include silicon oxide, a material having a dielectric constant substantially higher than that of silicon oxide, and the like.

A first conductive layer and a gate mask 206 are sequentially formed on the gate insulation layer. The first conductive layer may include polysilicon doped with impurities. The first conductive layer may be patterned to form a gate electrode through the subsequent processes. The first conductive layer may have a multilayer structure including a doped polysilicon layer and a metal layer. The gate mask 206 may include a material having a high etching selectivity with respect to a first insulating interlayer 220 (see FIG. 8). For example, when the first insulating interlayer 220 includes an oxide, such as silicon oxide, the gate mask 206 may include a nitride, such as silicon nitride.

Thereafter, the first conductive layer and the gate insulation layer are sequentially patterned by using the gate mask 206 as an etching mask. Thus, a plurality of gate structures 210 is formed on the substrate 200, wherein each of the gate structures 210 includes a gate insulation layer pattern, a gate electrode 204 and the gate mask 206.

Thereafter, a silicon nitride layer is formed on the substrate 200 having the gate structures 210, and then anisotropically etched to form a gate spacer at both sidewalls of each of the gate structures 210.

Impurities are implanted into the substrate 200 exposed between the gate structures 210 through an ion implantation process by using the gate structures 210 having the gate spacer as a mask. Thereafter, a first contact region 212 and a second contact region 214, which correspond to source/drain regions, are formed on the substrate 200 through a thermal treatment process. The first contact region 212 corresponds to a capacitor contact region making contact with a first pad 222, and the second contact region 214 corresponds to a bit line contact region making contact with a second pad 224. As a result, a plurality of transistors is formed on the substrate 200, wherein each of the transistors includes the gate structure 210, the first contact region 212 and the second contact region 214.

Figure 8:
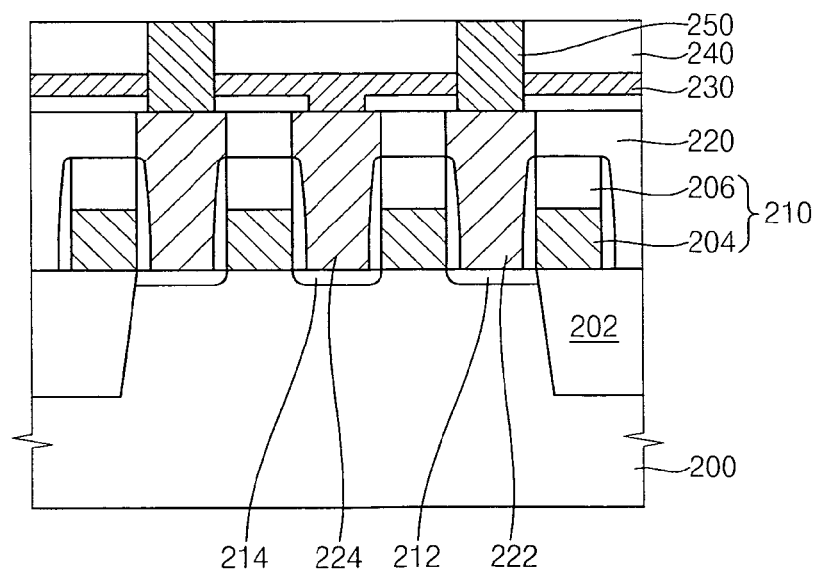

Referring to FIG. 8, a first insulating interlayer 220 is formed on the substrate 200. The first insulating interlayer 220 covers the transistor and includes an oxide. The first insulating interlayer 220 may be formed through a CVD process, a plasma-enhanced chemical vapor deposition (PECVD) process, a high-density plasma chemical vapor deposition (HDP-CVD) process, an ALD process and the like.

Thereafter, an upper portion of the first insulating interlayer 220 is removed through a chemical mechanical polishing (CMP) process to planarize an upper surface of the first insulating interlayer 220. In example embodiments, the first insulating interlayer 220 has a predetermined thickness from an upper surface of the gate mask 206.

A first photoresist pattern (not shown) is then formed on the first insulating interlayer 220. Thereafter, the first insulating interlayer 220 is partially anisotropically etched by using the first photoresist pattern as an etching mask to form a plurality of first contact holes (not shown) through the first insulating interlayer 220. The first contact holes expose the first contact region 212 and the second contact region 214. A portion of the first contact holes exposes the first contact region 212 corresponding to the capacitor contact region. A remainder of the first contact holes exposes the second contact region 214 corresponding to the bit line contact region. The first photoresist pattern is then removed through an ashing process and/or a stripping process.

A second conductive layer is formed to fill the first contact holes and to cover the first insulating interlayer 220. Examples of materials that may be used for the second conductive layer include polysilicon doped with impurities of a high concentration, a metal, a conductive metal nitride and the like.

The second conductive layer is then etched through a CMP process and/or an etch-back process to expose the upper surface of the first insulating interlayer 220. Thus, a first pad 222 and a second pad 224 are formed in the first contact holes. The first pad 222 is electrically connected to the capacitor contact region, and the second pad 224 is electrically connected to the bit line contact region.

A second insulating interlayer (not shown) is formed on the first insulating interlayer 220 having the first pad 222 and the second pad 224. The second insulating interlayer may serve to electrically separate the first pad 222 from a bit line formed through subsequent processes. Thereafter, a CMP process is performed to planarize an upper portion of the second insulating interlayer. A second photoresist pattern (not shown) is formed on the planarized second insulating interlayer. The second insulating interlayer is partially etched by using the second photoresist pattern as an etching mask to form a second contact hole (not shown) through the second insulating interlayer. The second contact hole exposes the second pad 224. The second contact hole corresponds to a bit line contact hole for electrically connecting the second pad 224 to the bit line. The second photoresist pattern is then removed through an ashing process and/or a stripping process.

A third conductive layer (not shown) is then formed on the second insulating interlayer. The third conductive layer fills the second contact hole. The third conductive layer is patterned to form a bit line 230 electrically connected to the second pad 224. The bit line 230 may include a first layer and a second layer. The first layer may include a metal and a metal oxide, and the second layer may include a metal. For example, the first layer may include titanium/titanium nitride (Ti/TiN), and the second layer may include tungsten (W).

Thereafter, a third insulating interlayer 240 is formed to cover the second insulating interlayer having the bit line 230. Examples of materials that may be used for the third insulating interlayer 240 include BPSG, PSG, USG, SOG, PE-TEOS, HDP-CVD oxide, and the like.

A third photoresist pattern (not shown) is then formed on the third insulating interlayer 240. The second insulating interlayer and the third insulating interlayer 240 are partially etched by using the third photoresist pattern as an etching mask to form a plurality of third contact holes exposing the first pad 222. A contact pad of a capacitor may be formed in each of the third contact holes.

A fourth conductive layer is then formed on the third insulating interlayer 240. The fourth conductive layer fills the third contact holes. A CMP process is performed on the fourth conductive layer to form a third pad 250 in each of the third contact holes. An example of a material that may be used for the third pad 250 includes polysilicon, into which impurities are doped. The third pad 250 may serve to connect the first pad 222 to a lower electrode formed through subsequent processes.

Figure 9:
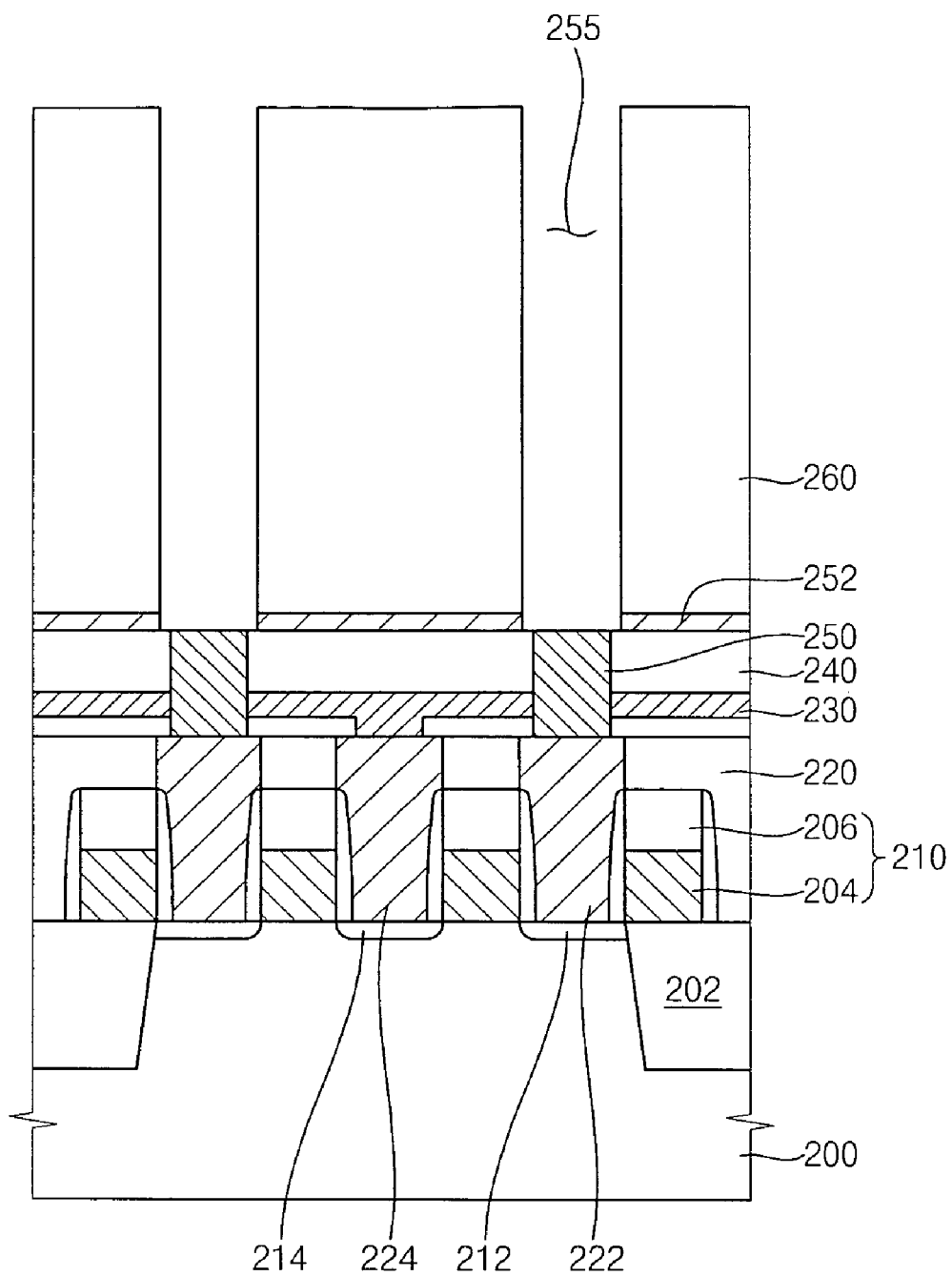

Referring to FIG. 9, an etch-stop layer 252 is formed on the third pad 250 and on the third insulating interlayer 240. The etch-stop layer 252 may serve to protect the third pad 250 when a mold layer 260 is selectively etched through subsequent processes to form an opening 255 through the mold layer 260. The thickness of the etch-stop layer 252 may be about 10 Å to about 200 Å. The etch-stop layer 252 may include a material having a low etching selectivity with respect to the mold layer 260, for example, a nitride, a metal oxide and the like.

The mold layer 260 is formed on the etch-stop layer 252. Examples of materials that may be used for the mold layer may 260 include silicon oxide, BPSG, PSG, USG, SOG, TEOS, HDP-CVD oxide and the like. The mold layer 260 may have a double-layer structure formed by depositing the materials sequentially. When the mold layer 260 has a double-layer structure including at least two layers having different etching ratios, the shape of a sidewall of a lower electrode of a capacitor, which is formed through subsequent processes, may be changed. The thickness of the mold layer 260 may vary depending on the desired capacitance of a capacitor. Since the height of a capacitor depends on the thickness of the mold layer 260, the thickness of the mold layer 260 may vary so as to form a capacitor having a desired capacitance.

Thereafter, the mold layer 260 and the etch-stop layer 252 are partially etched to form an opening 255 to expose the third contact 250. When the opening 255 is formed, the etch-stop layer 252 may be over-etched to entirely remove the etch-stop layer 252 on the bottom of the opening 255. Thus, an upper portion of the third contact 250 may be partially etched when the etch-stop layer 252 is etched.

Figure 10:
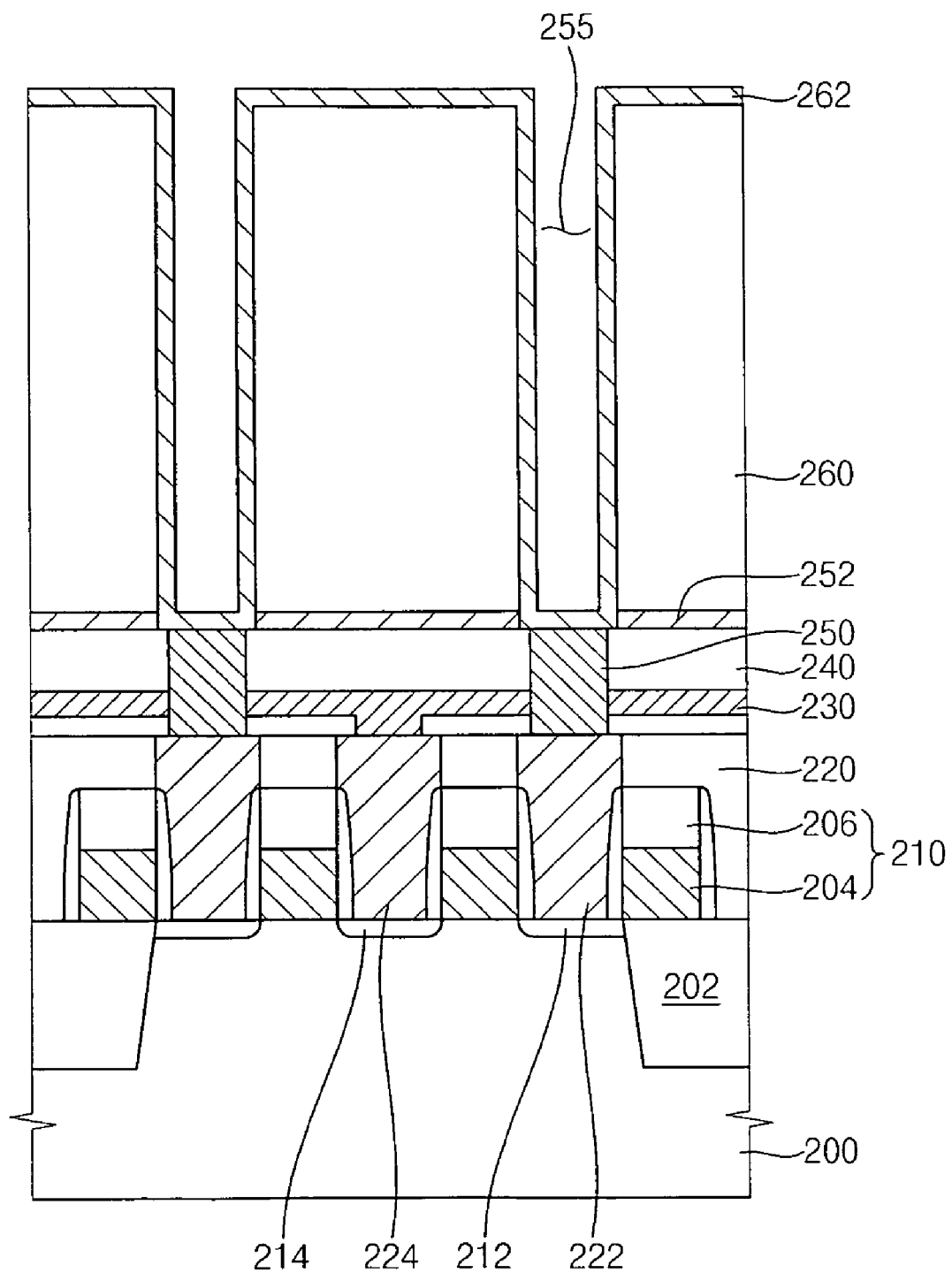

Referring to FIG. 10, a conductive layer 262 for forming a lower electrode is continuously formed at the sidewall and the bottom of the opening 255 and on the mold layer 260. The conductive layer 262 includes a material different from the third contact 250. For example, the conductive layer 262 may include a metal, a metal-containing material and the like. Examples of materials that may be used for the conductive layer 262 include titanium, titanium nitride and the like. The conductive layer 262 may have a multilayer structure. For example, the conductive layer 262 may have a double-layer structure including a titanium layer and a titanium nitride layer. When the conductive layer 262 does not include polysilicon but includes a metal, a metal-containing material and the like, a depletion layer is not formed at an interface between a lower electrode and a dielectric layer, which are formed through subsequent processes. Thus, the capacitance of a capacitor may be increased. Since the conductive layer 262 is formed on an inner surface of the opening having a relatively large aspect ratio, the conductive layer 262 may be formed through a deposition method having relatively good step-coverage characteristics. In some embodiments, the conductive layer 262 has a relatively thin thickness so as to not entirely fill the opening 255. Thus, the conductive layer 262 may be formed through, for example, a CVD process, a cyclic CVD process, an ALD process and the like.

Figure 11:
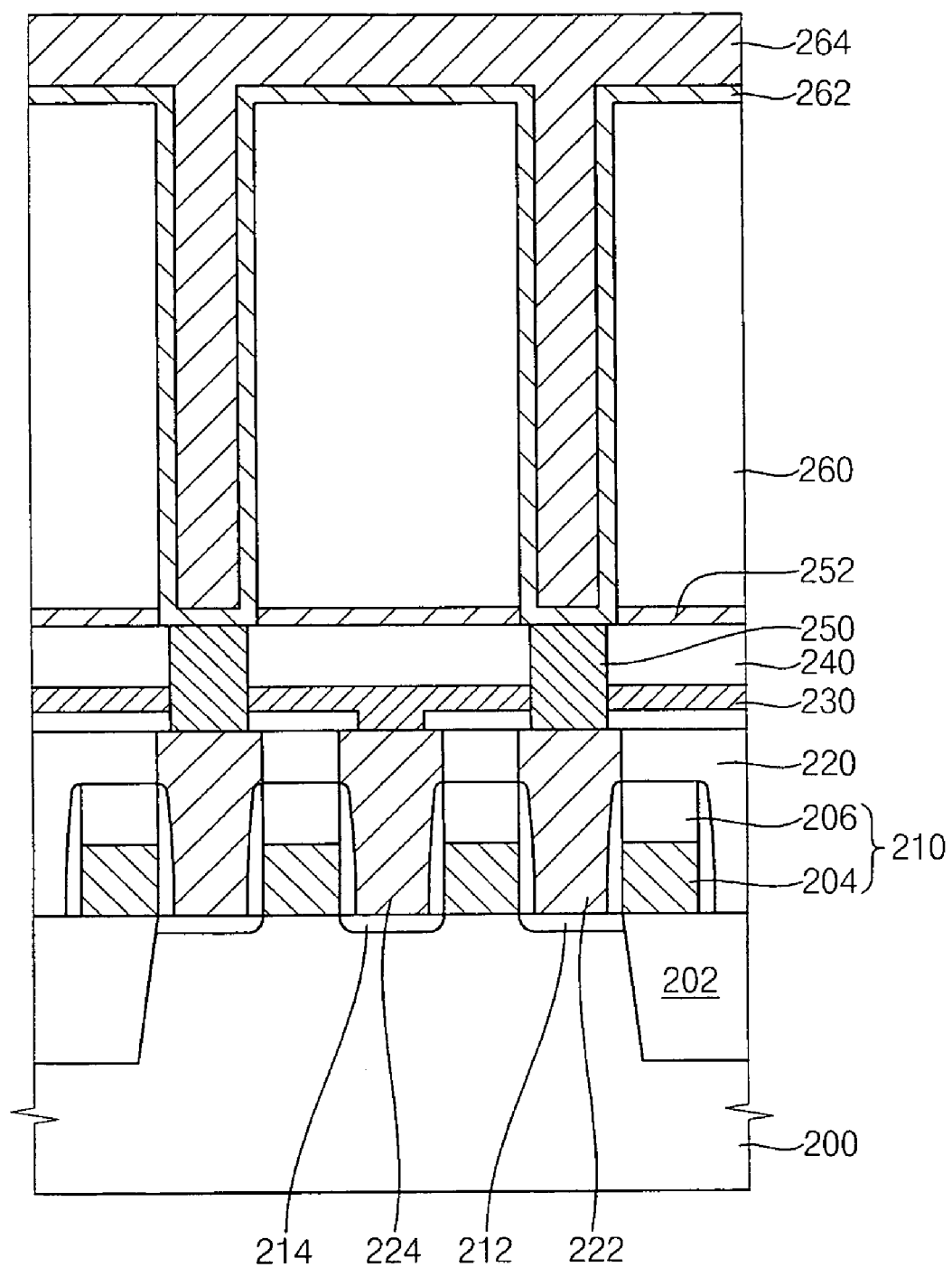

Referring to FIG. 11, a preliminary buffer layer 264 is formed to fill the opening 255 and to cover the conductive layer 262. For example, the preliminary buffer layer 264 may be formed by coating a polysiloxane composition including about 2% to about 7% by weight of a siloxane polymer represented by the following Chemical Formula 1 and about 93% to about 98% by weight of an organic solvent. The number-average molecular weight of the siloxane polymer may be about 5,000 to about 8,000, and the PDI of the siloxane polymer may be about 1.3 to about 1.7. In Chemical Formula 1, each R may independently represent an alkyl group having 1 to 5 carbon atoms, and n may be a natural number such that the number-average molecular weight of the siloxane polymer may be about 5,000 to about 8,000.

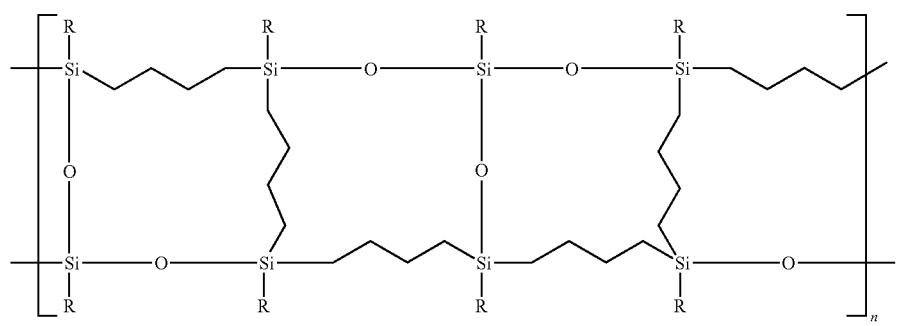

<Chemical Formula 1>

The siloxane polymer and the siloxane polymer composition are substantially the same as the above-explained siloxane polymer and the above-explained siloxane polymer composition. Thus, any further explanations in these regards will be omitted.

The preliminary buffer layer 264 in example embodiments is formed using the siloxane polymer composition including the siloxane polymer so that an exposing process can be omitted. Thus, a high-cost exposing device may be not required.

Figure 12:
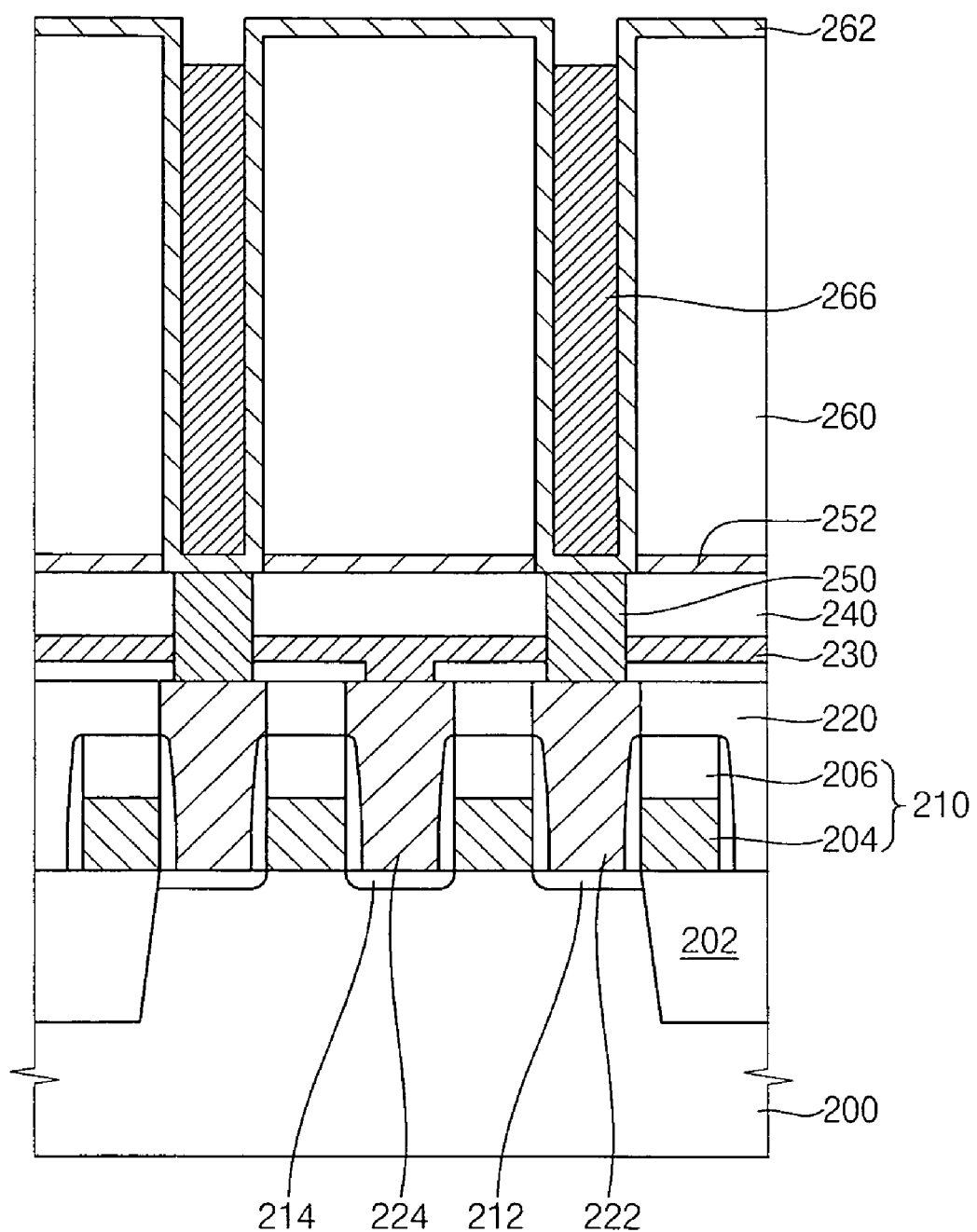

Referring to FIG. 12, the preliminary buffer layer is baked and cured. For example, the preliminary buffer layer may be baked at a temperature of about 160° C. to about 240° C., for example, at a temperature of about 180° C. to about 220° C. Thus, a buffer layer is formed. The buffer layer may be a spin-on-glass layer to fill the opening and to cover an upper surface of the conductive layer 262. Thereafter, the buffer layer is etched to expose the conductive layer disposed on the mold layer. For example, the buffer layer may be etched through a wet-etching process using an etching solution including hydrofluoric acid. As a result, a buffer layer pattern 266 is formed on the conductive layer in the opening.

Figure 13:
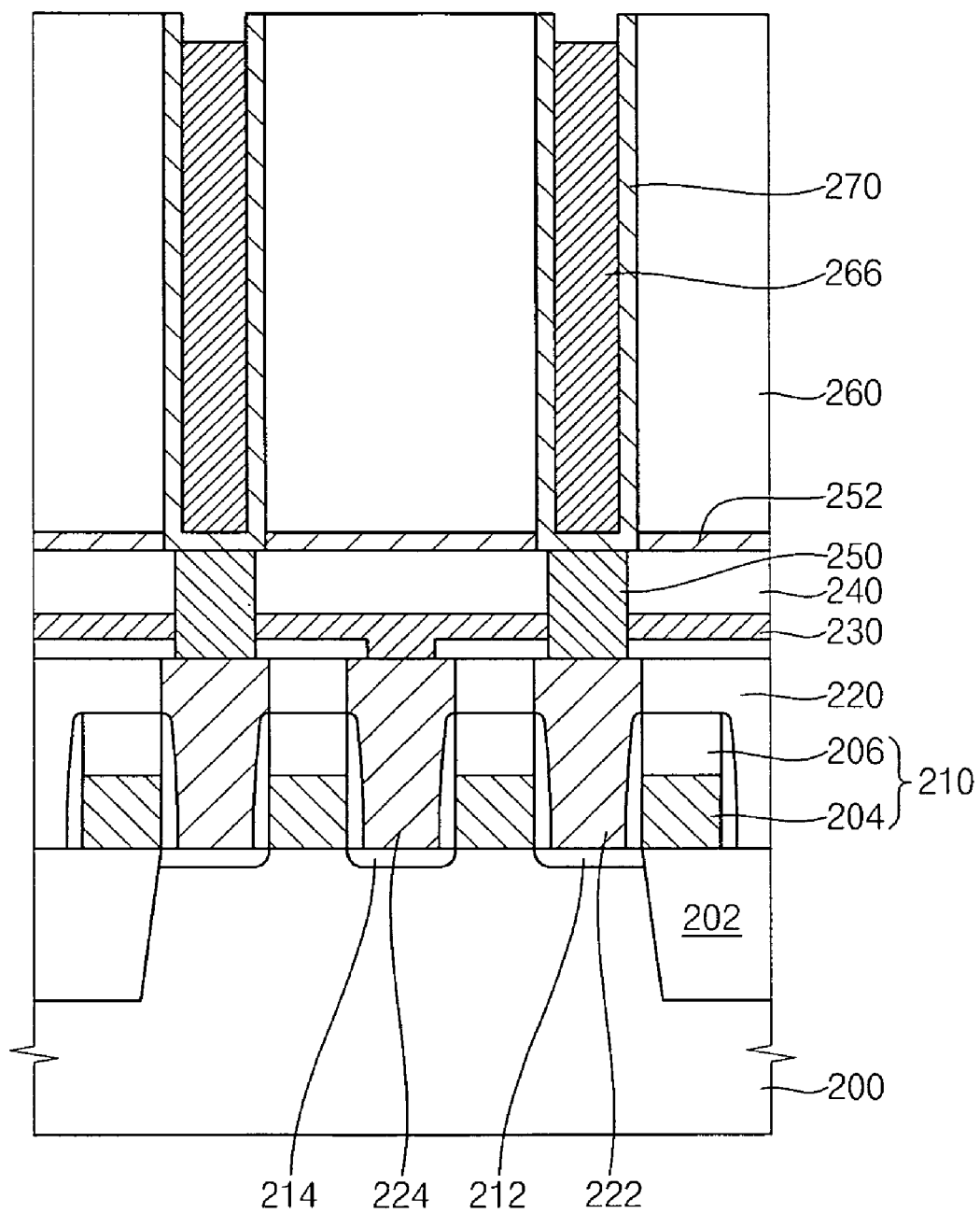

Referring to FIG. 13, the conductive layer 262 disposed on the mold layer is 260 is removed to form a lower electrode 270. For example, the conductive layer 262 may be etched using the buffer layer pattern 266 as an etching mask to expose an upper surface of the mold layer 260. Thus, the lower electrode 270 making contact with a sidewall surrounding the opening 255 and having a cylindrical shape is formed. The buffer layer pattern 266 remains in a cylinder of the lower electrode 270, and an outer sidewall of the lower electrode 270 is surrounded by the mold layer 260.

Figure 14:
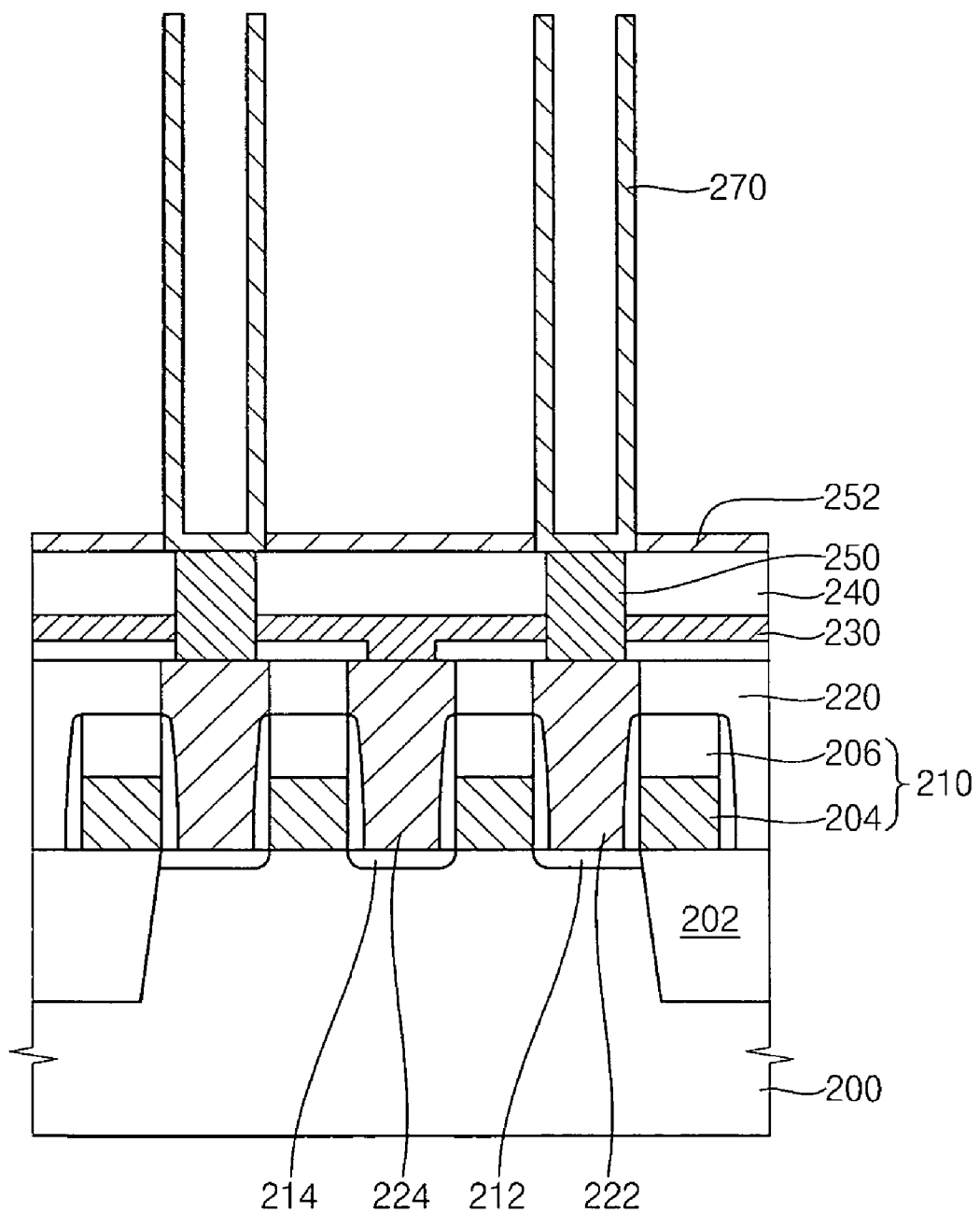

Referring to FIG. 14, the mold layer 260 and the buffer layer pattern 266 is removed through a wet-etching process using an etching solution. Since both the mold layer 260 and the buffer layer pattern 266 include an oxide, the mold layer 260 and the buffer layer pattern 266 may be removed in the same process, that is, a wet-etching process using an aqueous solution including hydrofluoric acid, such as an LAL solution including water, hydrofluoric acid and ammonium hydrofluoride. The LAL solution may further include a metal corrosion inhibitor and a surfactant to prevent corrosion of the lower electrode and to prevent adsorption of an oxide.

Figure 15:
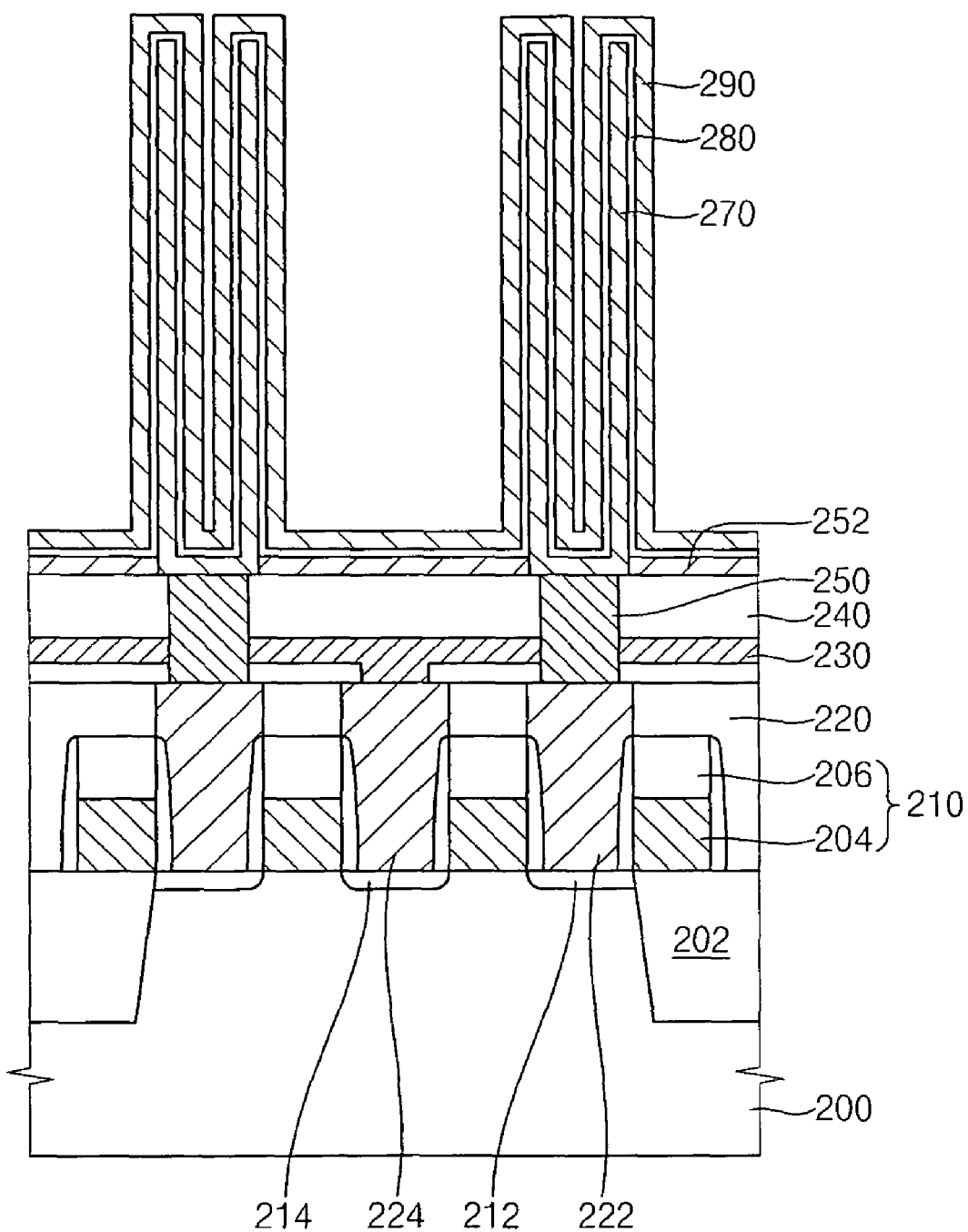

Referring to FIG. 15, a dielectric layer 280 having a uniform thickness is formed on the lower electrode 270. For example, a metal oxide having a relatively high dielectric constant may be deposited through a vapor deposition method to form the dielectric layer 280. Examples of metal oxides include aluminum oxide, hafnium oxide and the like.

Thereafter, an upper electrode 290 is formed on the dielectric layer 280. The upper electrode 290 may include a metal, a material containing a metal and the like. Alternatively, after a metal or a material containing a metal is deposited to form a lower layer, polysilicon may be deposited on the lower layer to form the upper electrode 290 having a multilayer structure.

A dynamic random access memory (DRAM) device may be completed through the above-mentioned processes.

Hereinafter, embodiments of the present invention are described more fully with reference to synthetic examples, manufacturing examples and evaluations of the siloxane polymer composition. However, it is understood that the present invention should not be limited to these examples but various changes and modifications can be made by one ordinary skilled in the art within the spirit and scope of the present invention.

Synthesis of a Silicone Compound

A first silicone compound represented by the following Chemical Formula 5 and a second silicone compound represented by the following Chemical Formula 6 were prepared. The first silicone compound and the second silicone compound were mixed in a mole ratio of about 1:3, and then reacted in an ice bath for about 4 hours. Thereafter, the mixture was isolated by distillation so that about 65% of a silicone compound (tris(methyldivinylsilyloxy)methylsilane) represented by the following Chemical Formula 7 was obtained.

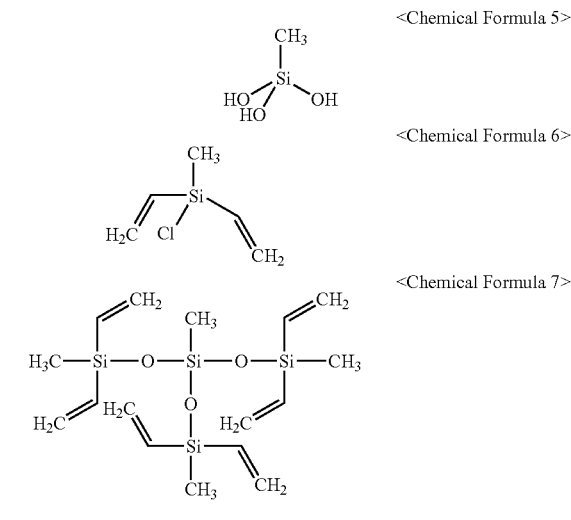

<Chemical Formula 5>

<Chemical Formula 6>

<Chemical Formula 7>

The silicone compound represented by Chemical Formula 7 was identified through hydrogen nuclear magnetic resonance ($^1$H-NMR) spectroscopy. Spectroscopy was performed using benzene as a solvent, and a 300 MHz NMR device was used. Hydrogen nuclear magnetic resonance spectra revealed peaks at: 0.03 (s, 12H), 0.47 ppm (s, 6H) and 5.4 ppm (d, 6H).

Synthesis of a Siloxane Polymer Composition

The silicone compound represented by Chemical Formula 7 was reacted using a platinum catalyst so that a siloxane polymer represented by the following Chemical Formula 8 was obtained. The number-average molecular weight of the siloxane polymer was about 8,000, and the PDI of the siloxane polymer was about 1.4. About 4% by weight of the siloxane polymer and about 96% by weight of propylene glycol monomethyl ether acetate were mixed to prepare a siloxane polymer composition. n was a natural number such that the number-average molecular weight of the siloxane polymer was about 8,000.

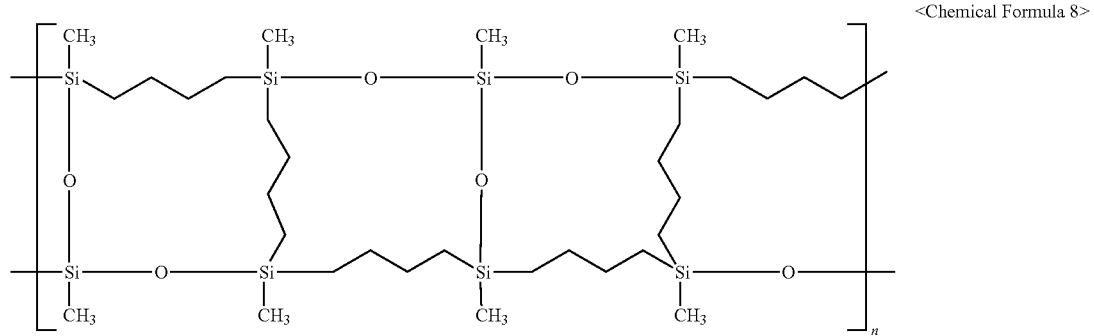

<Chemical Formula 8>

Evaluation of Gap-Filling Characteristics

The siloxane polymer composition was spin-coated on a substrate having a mold layer pattern having an opening and a lower electrode layer (Ti/TiN) disposed on the mold layer pattern to form a coating layer. The depth of the opening was about 1,000 Å, and the thickness of the lower electrode layer was about 500 nm. Thereafter, the coating layer was baked at a temperature of about 160° C. to about 240° C. to form a buffer layer. After the buffer layer was cut, a cross-section of the buffer layer was measured by a scanning electron microscope to evaluate the coating uniformity and the gap-filling characteristics of the polysiloxane composition. The results are shown in FIG. 16.

Figure 16:
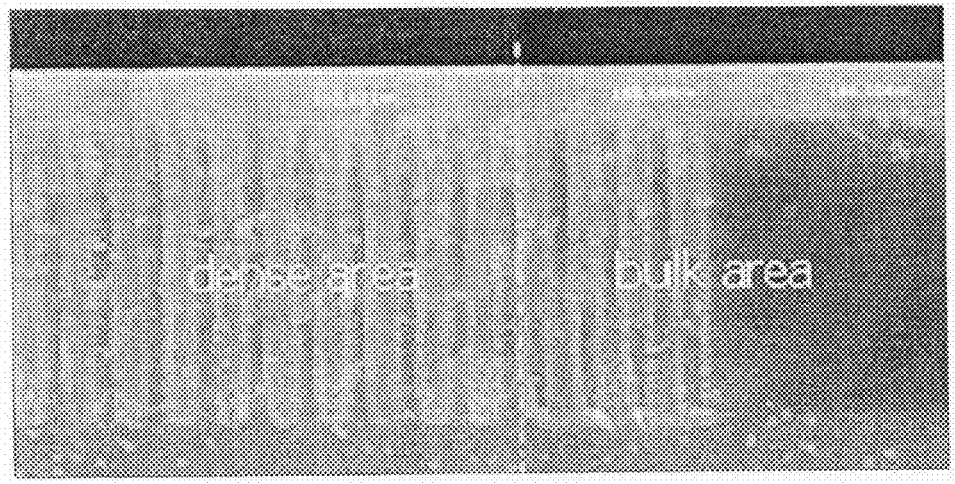
FIG. 16 is a scanning electron microscopic (SEM) picture showing a cross-section of a buffer layer formed using a polysiloxane composition according to an example.

FIG. 16 is a scanning electron microscope (SEM) picture showing a cross-section of the buffer layer formed using the siloxane polymer composition according to the above example.

Referring to FIG. 16, the buffer layer formed using the siloxane polymer composition entirely filled the opening and covered the mold layer pattern. Furthermore, a surface of the buffer layer formed on the mold layer pattern was uniform. Thus, the buffer layer formed using the polysiloxane composition may be used for forming a lower electrode of a capacitor.

Evaluation of Residual Characteristics

A substrate was prepared. The substrate included a mold layer pattern (silicon oxide layer pattern) having an opening with a depth of about 1,000 Å, a lower electrode having a cylindrical shape and disposed in the opening, and a buffer layer pattern surrounded by the lower electrode in the opening and including the above siloxane polymer composition. Thereafter, the buffer layer pattern and the mold layer pattern were removed through the same process using an LAL solution including water, ammonium hydrofluoride and hydrofluoric acid. The substrate was observed by a scanning electron microscope to evaluate residual characteristics of the buffer layer pattern. The results are shown in FIG. 17.

Figure 17:
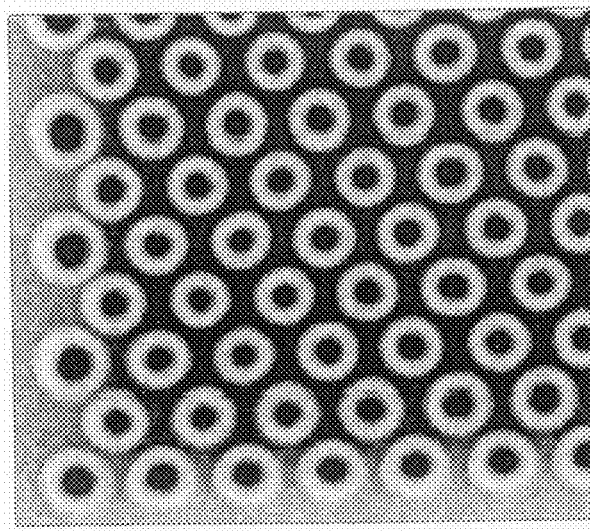
FIG. 17 is an SEM picture showing a substrate after a buffer layer pattern is removed, the buffer layer being formed using a polysiloxane composition according to an example.

FIG. 17 is an SEM picture showing a substrate after a buffer layer pattern is removed, the buffer layer being formed using the siloxane polymer composition according to the above example.

Referring to FIG. 17, the buffer layer pattern and the mold layer pattern were removed in the same process using the LAL solution. Furthermore, etching residues of the buffer layer pattern did not remain on the substrate and on a surface of the lower electrode after the buffer layer pattern was removed. Thus, the buffer layer pattern formed using the polysiloxane composition may be used for forming a lower electrode of a capacitor.

In some embodiments, a buffer layer pattern includes a siloxane polymer having a number-average molecular weight of about 5,000 to about 8,000 and being represented by Chemical Formula 1. The buffer layer pattern may have characteristics substantially similar to a silicon oxide layer pattern and may be removed with the oxide layer pattern through a wet-etching process after a conductive layer pattern is formed. Thus, the method using the siloxane polymer composition may simplify manufacturing processes for a capacitor and a semiconductor device, and may improve their efficiencies.

The foregoing is illustrative and is not to be construed as limiting. Although exemplary embodiments of the present invention have been described, those skilled in the art will readily appreciate that many modifications are possible without materially departing from the novel teachings and advantages described herein. Accordingly, all such modifications are intended to be included within the scope of the present invention as defined in the claims. It is to be understood that the foregoing is illustrative and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a capacitor, the method comprising:
    forming a mold layer pattern on a substrate having a conductive structure, the mold layer pattern having an opening exposing the conductive structure;
    forming a conductive layer on a bottom and sidewalls of the opening and on the mold layer pattern;
    forming a buffer layer pattern on the conductive layer formed in the opening, the buffer layer pattern including a siloxane polymer represented by the following Chemical Formula 1, wherein each R independently represents an alkyl group having 1 to 5 carbon atoms, and n represents a natural number;
    selectively removing the conductive layer on the mold layer pattern to form a lower electrode;
    removing the mold layer pattern and the buffer layer pattern using an etching solution including hydrofluoric acid;
    forming a dielectric layer on the substrate having the lower electrode; and
    forming an upper electrode on the dielectric layer

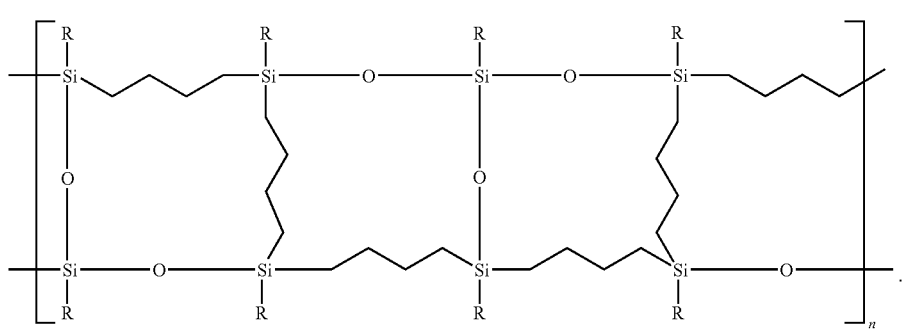

<Chemical Formula 1>

2. The method of claim 1, wherein the siloxane polymer is formed by cross-linking a silicone compound represented by the following Chemical Formula 2, wherein each R independently represents an alkyl group having 1 to 5 carbon atoms <Chemical Formula 2>

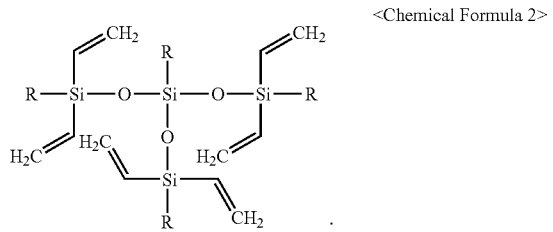

3. The method of claim 1, wherein the siloxane polymer has a number-average molecular weight of about 5,000 to about 8,000, and has a PDI of about 1.3 to about 1.7.

4. The method of claim 1, wherein forming a buffer layer pattern comprises:
   forming a preliminary buffer layer that fills the opening having the conductive layer and covers the conductive layer on the oxide layer pattern by spin-coating with a polysiloxane composition including about 2% to about 7% by weight of the siloxane polymer and about 93% to about 98% by weight of an organic solvent;
   heating the preliminary buffer layer at a temperature about 160° C. to about 240° C. to form a buffer layer; and
   etching an upper portion of the buffer layer to form the buffer layer pattern in the opening.

5. The method of claim 1, wherein the mold layer pattern includes a silicon oxide.

6. The method of claim 1, wherein the etching solution comprises a limulus amebocyte lysate (LAL) etching solution including water, ammonium hydrofluoride and hydrofluoric acid.

* * * * *